US012119234B2

(12) United States Patent
Wu

(10) Patent No.: US 12,119,234 B2
(45) Date of Patent: Oct. 15, 2024

(54) SEMICONDUCTOR STRUCTURE AND METHOD FOR MANUFACTURING SAME

(71) Applicant: CHANGXIN MEMORY TECHNOLOGIES, INC., Anhui (CN)

(72) Inventor: Ping-Heng Wu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 302 days.

(21) Appl. No.: 17/649,064

(22) Filed: Jan. 26, 2022

(65) Prior Publication Data

US 2022/0157620 A1    May 19, 2022

Related U.S. Application Data

(63) Continuation of application No. PCT/CN2021/109038, filed on Jul. 28, 2021.

(30) Foreign Application Priority Data

Nov. 16, 2020  (CN) .......................... 202011279435.6

(51) Int. Cl.
*H01L 21/48* (2006.01)
*H01L 21/768* (2006.01)
(Continued)

(52) U.S. Cl.
CPC ...... *H01L 21/481* (2013.01); *H01L 21/76877* (2013.01); *H01L 21/76898* (2013.01); *H01L 25/0657* (2013.01); *H01L 25/50* (2013.01); H01L 23/481 (2013.01); H01L 2224/16145 (2013.01); H01L 2225/06541 (2013.01)

(58) Field of Classification Search
CPC ............ H01L 21/481; H01L 21/76877; H01L 21/76898; H01L 25/0657; H01L 25/50; H01L 2225/06541; H01L 21/768; H01L 23/481; H01L 23/538; H01L 23/562;
(Continued)

(56) References Cited

U.S. PATENT DOCUMENTS 7,485,967 B2    2/2009  Kameyama
8,772,946 B2    7/2014  Uzoh
(Continued)

FOREIGN PATENT DOCUMENTS

CN          1841718 A     10/2006
CN         102130041 A     7/2011
(Continued)

OTHER PUBLICATIONS

European Patent Office action in Application No. 21890682.4, mailed on Jan. 23, 2024.

*Primary Examiner* — Patricia D Valenzuela
(74) *Attorney, Agent, or Firm* — Syncoda LLC; Feng Ma

(57) ABSTRACT

A semiconductor structure includes: a base; a conductive column, which is at least located in the base; an electric connection layer, which is connected to an end part of the conductive column. The end part, towards the electric connection layer, of the conductive column has a first protruding part and at least one groove defined by the first protruding part, the electric connection layer has a second protruding part at a position corresponding to the groove, and the second protruding part is embedded in the groove.

5 Claims, 34 Drawing Sheets

(51) Int. Cl.
*H01L 25/00* (2006.01)
*H01L 25/065* (2023.01)
*H01L 23/48* (2006.01)

(58) Field of Classification Search
CPC .......... H01L 21/76838; H01L 23/5384; H01L 23/5386; H01L 2221/1068; H01L 2224/16145
See application file for complete search history.

(56) References Cited

U.S. PATENT DOCUMENTS

| | | |
|---|---|---|
| 9,000,600 B2 | 4/2015 | Uzoh et al. |
| 9,165,898 B2 | 10/2015 | Kameyama |
| 9,349,669 B2 | 5/2016 | Uzoh et al. |
| 9,773,831 B1 | 9/2017 | Yang et al. |
| 2006/0202348 A1 | 9/2006 | Kameyama |
| 2009/0124078 A1 | 5/2009 | Kameyama |
| 2010/0105169 A1 | 4/2010 | Lee et al. |
| 2012/0049358 A1 | 3/2012 | Cheng |
| 2013/0154107 A1 | 6/2013 | Kim et al. |
| 2013/0328186 A1 | 12/2013 | Uzoh |
| 2014/0054743 A1 | 2/2014 | Hurwitz et al. |
| 2014/0217607 A1 | 8/2014 | Uzoh et al. |
| 2015/0111346 A1 | 4/2015 | Chun et al. |
| 2015/0187673 A1 | 7/2015 | Uzoh et al. |
| 2015/0235898 A1 | 8/2015 | Vick et al. |
| 2017/0047270 A1* | 2/2017 | Lee ................ H01L 21/76898 |
| 2019/0221472 A1 | 7/2019 | Kouassi et al. |
| 2021/0005533 A1* | 1/2021 | Cho .................... H01L 24/08 |

FOREIGN PATENT DOCUMENTS

| | | |
|---|---|---|
| CN | 104718611 A | 6/2015 |
| JP | 2008153352 A | 7/2008 |

\* cited by examiner

SEMICONDUCTOR STRUCTURE AND METHOD FOR MANUFACTURING SAME

CROSS-REFERENCE TO RELATED APPLICATIONS

This is a continuation of International Application No. PCT/CN2021/109038 filed on Jul. 28, 2021, which claims priority to Chinese Patent Application No. 202011279435.6 filed on Nov. 16, 2020. The disclosures of the above-referenced applications are hereby incorporated by reference in their entirety.

BACKGROUND

Interconnection between chips or wafers in a semiconductor structure can be realized by manufacturing via holes in a perpendicular direction, and such interconnection technology is called as a Through Silicon Via (TSV) technology. The TSV is usually filled with a metal material to form a conductive column, and the end face of the conductive column is connected to an electric connection layer to implement electrical signal transmission between different layers.

SUMMARY

Embodiments of this disclosure relate to a semiconductor structure and a method for manufacturing same.

According to some embodiments of this disclosure, on the one hand, the embodiments of this disclosure provide a semiconductor structure, including: a base; a conductive column, which is at least located in the base; and an electric connection layer, which is connected to an end part of the conductive column. The end part, towards the electric connection layer, of the conductive column, has a first protruding part and at least one groove defined by the first protruding part, the electric connection layer has a second protruding part at a position corresponding to the groove, and the second protruding part is embedded into the groove.

According to some embodiments of this disclosure, on the other hand, the embodiments of this disclosure provide a method for manufacturing a semiconductor structure. The method includes: a base including a conductive column region is provided, a first through hole is formed in the conductive column region in the base, and at least one first protruding structure is provided at the bottom of the first through hole; the first through hole is filled to form a conductive column, which has a groove at a position corresponding to the first protruding structure, and has a first protruding part that defines the groove; the base closing to the first protruding structure is etched to expose the bottom of the groove; and an electric connection layer filling up the groove is formed, and the electric connection layer has a second protruding part at a position corresponding to the groove.

BRIEF DESCRIPTION OF THE DRAWINGS

One or more embodiments are illustrated by the corresponding drawings. Unless otherwise stated, the drawings do not constitute scale limit.

DETAILED DESCRIPTION

Figure 1:
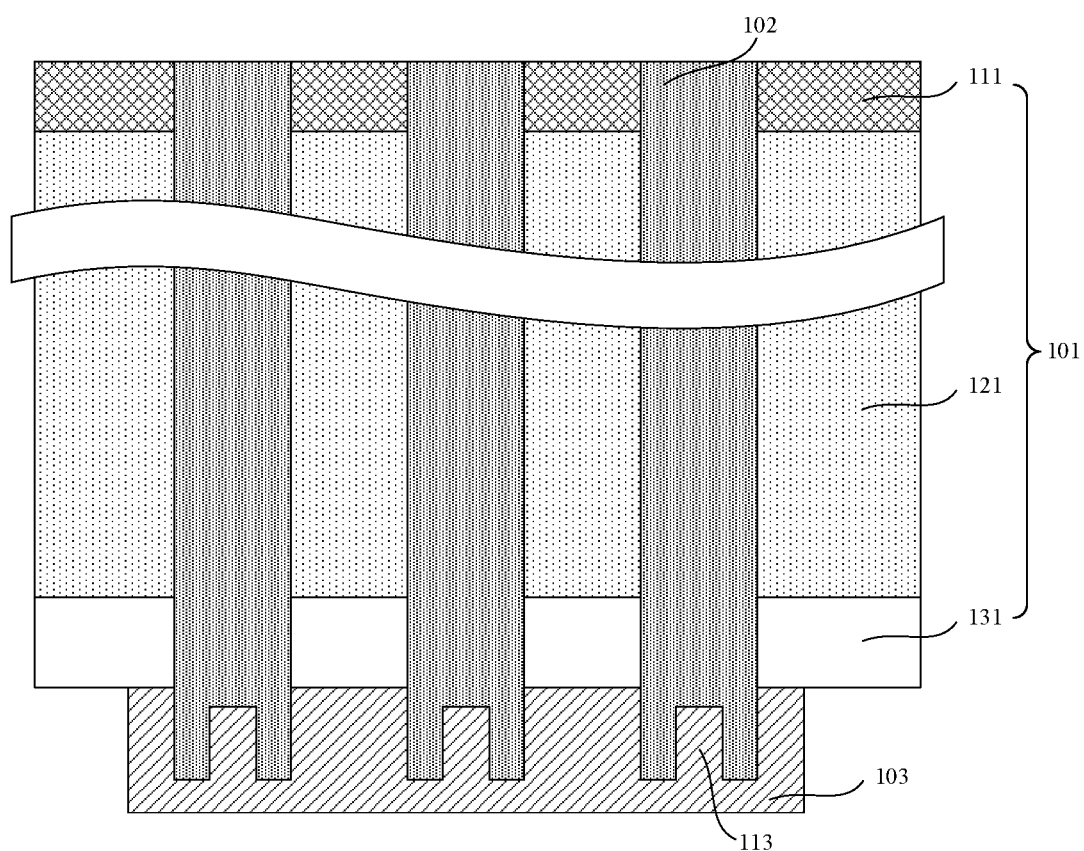
FIG. 1 is a schematic diagram of a sectional structure of a semiconductor structure according to an embodiment of this disclosure.

The end face of the conductive column and the end face of the electric connection layer are relatively flat at the contact position between the conductive column and the electric connection layer. When the contact position between the conductive column and the electric connection layer is affected by stress, the end face of the conductive column and the end face of the electric connection layer are easily to slide relatively on the contact interface, thus there is a great risk that the electric connection layer may break away from the end face of the conductive column.

The electric connection layer connected to the conductive column is easily affected by stresses, thus may break away from the end face connected to the conductive column.

It has been found by analysis that the thermal expansion of the conductive column will generate a pressure on the contact position between the electric connection layer and the conductive column, and the contact position between the electric connection layer and the conductive column may also be affected by the stress in a subsequent process for forming other structures. The end face of the conductive column and the end face of the electric connection layer are relatively flat at the contact position between the conductive column and the electric connection layer, thus the electric connection layer is easily affected by the stress and breaks away the from end face of the conductive column.

Embodiments of this disclosure provide a semiconductor structure. The end part, towards electric connection layer, of the conductive column, is provided with a first protruding part and at least one groove defined by the first protruding part, and an electric connection layer is provided with a second protruding part at a position corresponding to the groove, so that the groove of the conductive column abuts against the second protruding part of the electric connection layer, and the total contact area at the contact position between the conductive column and the electric connection layer is increased, which is beneficial to increase the connection force between the conductive column and the electric connection layer and thus reduce the risk that the electric connection layer breaks away from the conductive column. In addition, the side surface of the groove abuts against the side surface of the second protruding part, so the relative sliding between the conductive column and the electric connection layer is prevented, and the risk that the electric connection layer breaks away is further reduced.

In order to make the objectives, technical solution and advantages of the embodiments of this disclosure clearer, the embodiments of this disclosure will be described in detail below in combination with the drawings. However, those of ordinary skill in the art may understand that, in various embodiments of this disclosure, various technical details are provided for readers to understand this disclosure better. However, even without these technical details as well as various changes and modifications based on the embodiments below, the technical solution claimed by this disclosure may also be implemented.

Figure 2:
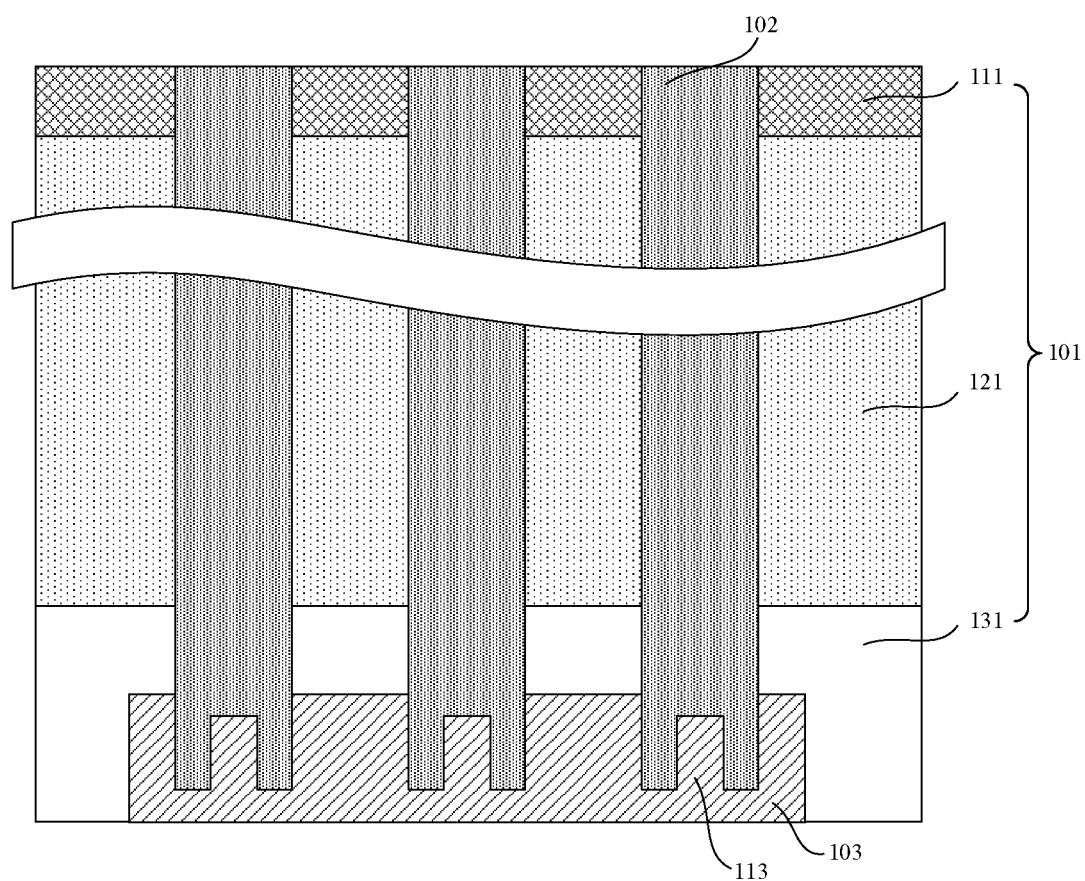
FIG. 2 is a schematic diagram of another sectional structure of a semiconductor structure according to an embodiment of this disclosure.
Figure 3:
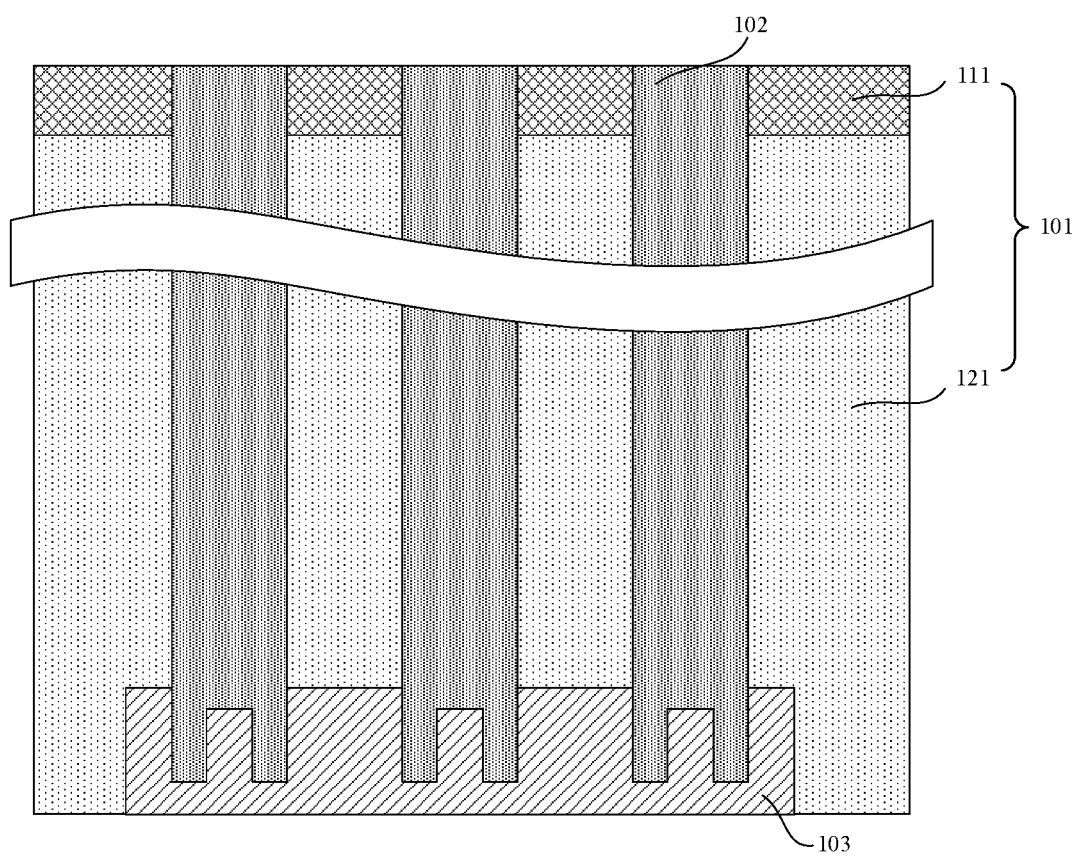
FIG. 3 is a schematic diagram of yet another sectional structure of a semiconductor structure according to an embodiment of this disclosure.
Figure 4:
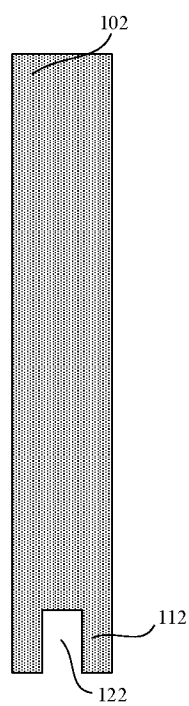
FIG. 4 is a first schematic diagram of several sectional structures of a conductive column according to an embodiment of this disclosure.
Figure 5:
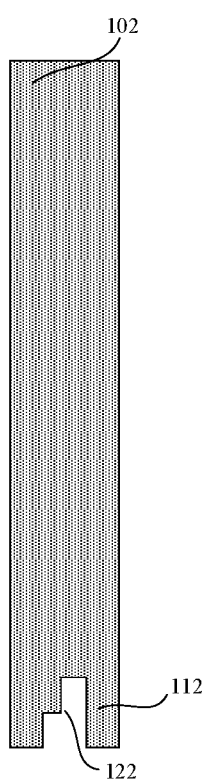
FIG. 5 is a second schematic diagram of several sectional structures of a conductive column according to an embodiment of this disclosure.
Figure 6:
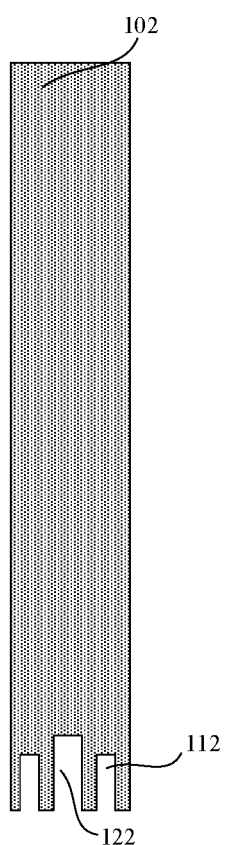
FIG. 6 is a third schematic diagram of several sectional structures of a conductive column according to an embodiment of this disclosure.

FIG. 1 is a schematic diagram of a sectional structure of a semiconductor structure according to an embodiment of this disclosure, FIG. 2 is a schematic diagram of another sectional structure of a semiconductor structure according to an embodiment of this disclosure, FIG. 3 is a schematic diagram of yet another sectional structure of a semiconductor structure according to an embodiment of this disclosure, and FIG. 4-FIG. 6 are schematic diagrams of several sectional structures of a conductive column according to an embodiment of this disclosure.

Referring to FIG. 1 and FIG. 4 in combination, in this embodiment, a semiconductor structure includes: a base 101; a conductive column 102, which is at least located in the base 101; and an electric connection layer 103, which is connected to an end part of the conductive column 102. The end part, towards the electric connection layer 103, of the conductive column 102, has a first protruding part 112 and at least one groove 122 defined by the first protruding part 112, the electric connection layer 103 has a second protruding part 113 at a position corresponding to the groove 122, and the second protruding part 113 is embedded into the groove 122.

The second protruding part 113 is embedded into the groove 122, so both the bottom surface and the side surface of the groove 122 contact with the second protruding part 113, and the total contact area at the contact position of the conductive column 102 and the electric connection layer 103 is increased, which is beneficial to increase the connection force between the conductive column 102 and the electric connection layer 103 and thus reduce the risk that the electric connection layer 103 breaks away from the conductive column 102, and is also beneficial to reduce the contact resistance between the conductive column 102 and the electric connection layer 103 and improve the electric performance of the semiconductor structure. In addition, the side surface of the groove 122 abuts against the side surface of the second protruding part 113, so the relative sliding between the conductive column 102 and the electric connection layer 103 is prevented in a direction perpendicular to central axis of the conductive column 102, and the risk that the electric connection layer 103 breaks away is further reduced.

Herein, the electric connection layer 103 is also located at the sides of the conductive column 102.

Still referring to FIG. 1, the conductive column 102 is partially located in the base 101, and another part of the conductive column 12 is located outside the base 101 and connected to the electric connection layer 103. Specifically, the electric connection layer 103 may cover all sides of the conductive column 102 located outside the base 101.

As the second protruding part 113 is mutually spliced with the groove 122 of the conductive column 102 and the side (namely, the periphery of the conductive column 102 located outside the base 101) of the conductive column 102 is also connected to the electric connection layer 103. It is beneficial to further increase the contact area between the conductive column 102 and the electric connection layer 103 to further increase the connection force between the conductive column 102 and the electric connection layer 103, thereby further reducing the risk that the electric connection layer 103 breaks away from the conductive column 102., It is also beneficial to reduce the contact resistance between the conductive column 102 and the electric connection layer 103, and improve the electric performance of the semiconductor structure.

In addition, the side surface of the conductive column 102 abuts against the electric connection layer 103, so the relative sliding between the conductive column 102 and the electric connection layer 103 is prevented in a direction perpendicular to central axis of the conductive column 102, and the risk that the electric connection layer 103 breaks away is further reduced.

In some embodiments, the base 101 includes a first dielectric layer 111, a substrate 121 and a second dielectric layer 131 that are successively stacked.

Herein, the first dielectric layer 111 and the second dielectric layer 131 are the material layers with low thermal expansion coefficients, such as a silicon dioxide layer, a silicon oxide layer or a silicon nitride layer, silicon carbon nitrogen, and the substrate 121 is a silicon substrate. In other embodiments, the substrate may also be a germanium substrate, a silicon germanium substrate, a silicon carbide substrate or silicon on an insulator substrate and other semiconductor substrates.

Herein, the conductive column 102 penetrates through the substrate 121, and the conductive column 102 is also located in the first dielectric layer 111 and the second dielectric layer 131.

In some embodiments, referring to FIG. 1, an electric connection layer 103 may be located on one side, away from a substrate 121, of a second dielectric layer 131. Correspondingly, conductive columns 102 penetrate through a first dielectric layer 111, the substrate 121 and the second dielectric layer 131, and the conductive columns 103 are also protruded from the second dielectric layers 131. In other embodiments, referring to FIG. 2, an electric connection layer 103 may also be located in a second dielectric layer 131. Correspondingly, conductive columns 102 only penetrates through a first dielectric layer 111 and a substrate 121, and the conductive columns 102 are located in partial second dielectric layer 131. In yet other embodiments, referring to FIG. 3, a base 101 includes a first dielectric layer 111 and a substrate 121, conductive columns 102 are located in a first dielectric layer 111 and the substrate 121, and an electric connection layer 103 is located in the substrate 121.

In the abovementioned embodiments, single electric connection layer 103 is connected to three conductive columns 102. In other embodiments, the number of the conductive columns connected to the single electric connection layer may be any, for example, 1, 2, 4, etc.

The orthographic projection of a groove 122 on the base 101 is an axisymmetric shape. Since the orthographic projection of the groove 122 on the base 101 is axisymmetric, the central axis of one groove 122 or the central axis of a combination structure composed of a plurality of grooves 122 can be coincided with the central axis of the conductive column 102, so that the grooves 122 are uniformly distributed at the end part of the conductive column 102, and the first protruding part 112 defining the groove 122 is also uniformly distributed at the end part of the conductive column 102. In addition, the second protruding part 113 is mutually spliced with the groove 122, so the central axis of the second protruding part 113 is also coincided with that of the conductive column 102. When the conductive structure is affected by a stress and there is a trend of relative sliding between the electric connection layer 103 and the base 101, the action force of the second protruding part 113 on the first protruding part 112 is uniformly distributed on the first protruding part 112, so as to prevent the deformation of the first protruding part 112.

It needs to be noted that, in other embodiments, the orthographic projection of the groove on the base is non-axisymmetric.

In a direction along the central axis of the conductive column 102, the depth range of the groove 122 is described below in combinations with FIG. 4-FIG. 6.

In some embodiments, referring to FIG. 4, the depth of the single groove 122 is fixed.

The process for forming the conductive column 102 with the groove 122 includes that the first through hole having the first protruding structure is formed and the first through hole is filled to form the conductive column 102. The fixed depth of the groove 122 is beneficial to uniformly fill a filling material in the first through hole, and thus improve the conductive performance of the conductive column 102.

In another embodiment, referring to FIG. 5, the single groove 122 is provided with at least two regions with different depths.

Specifically, the groove 122 may be step-shaped. Correspondingly, the second protruding part 113 mutually spliced with the groove 122 is also step-shaped, which is beneficial to increase the total volume of the conductive column 102, thus reduce the transmission resistance of the conductive column 102 itself and improve the transmission efficiency of an electric signal between the conductive column 12 and the electric connection layer 103.

In yet another embodiment, referring to FIG. 6, the end part of the conductive column 102 is provided with at least two grooves 122 spaced apart from each other, and various grooves 122 have different depths.

A plurality of grooves 122 are arranged at the position where the conductive column 102 and the electric connection layer 103 are connected, thus the electric connection layer 103 has a plurality of second protruding parts 113 corresponding to the grooves 122. This is beneficial to further increase the total contact area at the contact position between the conductive column 102 and the electric connection layer 103, increase the connection force between the conductive column 102 and the electric connection layer 103, and reduce the risk that the electric connection layer 103 breaks away from the conductive column 102.

It can be understood that, in other embodiments, at least two grooves spaced apart from each other may have the same depth.

The specific distribution of the first protruding part 112 and the groove 122 at the end part of a conductive column is described below in combination with FIG. 7-FIG. 13, which are schematic diagrams of several sectional structures of an end of a conductive column with a first protruding part and a groove according to an embodiment of this disclosure.

Figure 7:
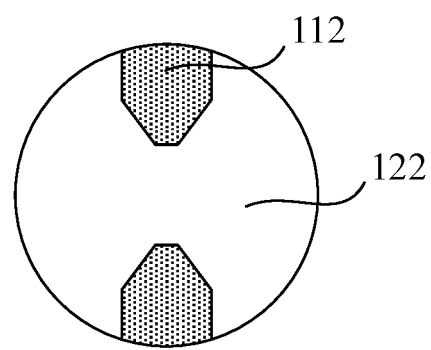
FIG. 7 is a first schematic diagram of several sectional structures of one end of a conductive column with a first protruding part and a groove according to an embodiment of this disclosure.
Figure 8:
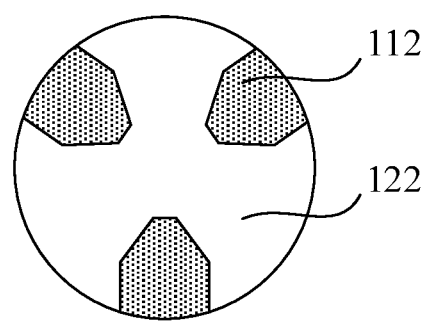
FIG. 8 is a second schematic diagram of several sectional structures of one end of a conductive column with a first protruding part and a groove according to an embodiment of this disclosure.
Figure 9:
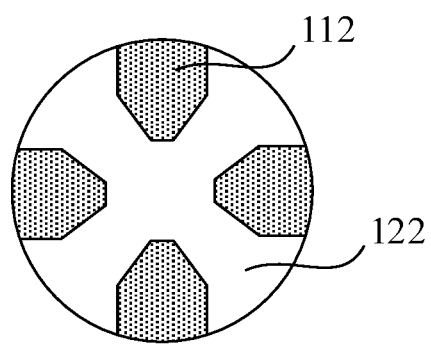
FIG. 9 is a third schematic diagram of several sectional structures of one end of a conductive column with a first protruding part and a groove according to an embodiment of this disclosure.

In some embodiments, referring to FIG. 7-FIG. 9, the end part of the conductive column has a plurality of the first protruding parts 112, and the orthographic projections of the plurality of first protruding parts 112 on the base 101 are axisymmetric. The end part of the conductive column 102 (referring to FIG. 4) is composed of the first protruding parts 112 and the groove 122, and the plurality of first protruding parts 112 define one groove 122.

Herein, referring to FIG. 7, two first protruding parts 112 are uniformly arranged around the central axis of the conductive column 102 at intervals. Or, referring to FIG. 8, three first protruding parts 112 are uniformly arranged around the central axis of the conductive column 102 at intervals. Or, referring to FIG. 9, four first protruding parts 112 are uniformly arranged around the central axis of the conductive column 102 at intervals. It needs to be noted that these embodiments do not make limitations to the number of the first protruding parts 112.

In addition, the sectional shape (namely, the orthographic projection of a first protruding part 112 on the base 101) of a first protruding part 112 is composed of a combination of one isosceles trapezoid and one arc-sided quadrangle. Herein, the arc-sided quadrangle is a four-sided enclosed shape having three straight lines and one curve. In other embodiments, the shape of the first protruding part may also be rectangular, circular, elliptic, etc.

It needs to be noted that the sectional shape of the conductive column 102 is circular, and the sectional shape of the first protruding part 112 and the sectional shape of the groove 122 together form the circle. In other embodiments, the shape of a conductive column may be other shapes.

Herein, the plurality of first protruding parts 112 define one groove 122, the single groove 122 has a plurality of sides in different directions, and the plurality of sides contact with the side of the second protruding part 113 of the electric connection layer 103. Therefore, when the contact position between the conductive column 102 and the electric connection layer 102 is affected by a stress in various direction, the sides of the groove 122 abut against the side of the second protruding part 113 in a plurality of directions, and then the relative sliding between the conductive column 102 and the electric connection layer 103 in the plurality of directions can be avoided, thereby further reducing the risk that the electric connection layer 103 breaks away.

Figure 10:
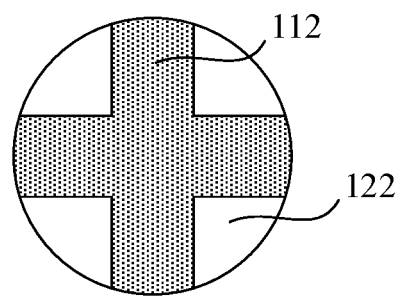
FIG. 10 is a fourth schematic diagram of several sectional structures of one end of a conductive column with a first protruding part and a groove according to an embodiment of this disclosure.
Figure 11:
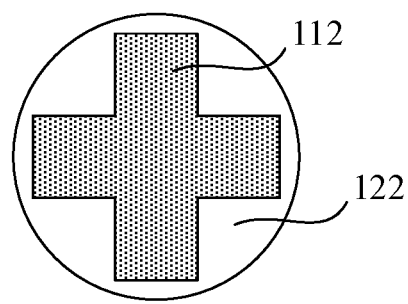
FIG. 11 is a fifth schematic diagram of several sectional structures of one end of a conductive column with a first protruding part and a groove according to an embodiment of this disclosure.
Figure 12:
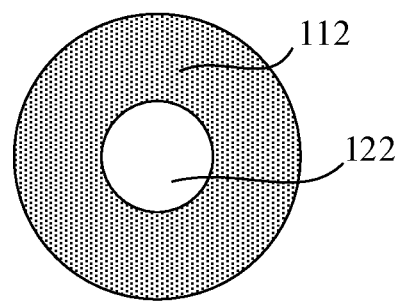
FIG. 12 is a sixth schematic diagram of several sectional structures of one end of a conductive column with a first protruding part and a groove according to an embodiment of this disclosure.

In other embodiments, referring to FIG. 10-FIG. 12, the end part of the conductive column has one first protruding part 112, and the orthographic projection of the first protruding part 112 on the base 101 is axisymmetric. The end part of the conductive column 102 is composed of the first protruding parts 112 and the groove(s) 122 together.

Herein, the orthographic projection of the first protruding part 112 on the base 101 is annular or crossed.

Referring to FIG. 10, the sectional shape (namely, the orthographic projection of the first protruding part 112 on the base 101) of the first protruding part 112 is quasi cross, namely, the four sides at the outermost periphery of the quasi cross are curves. Herein, the first protruding part 112 and four grooves 112 form the end part of the conductive column 102 together. Or, referring to FIG. 11, the sectional shape of the first protruding part 112 is a standard cross, namely, each side of the cross is a straight line. Herein, the first protruding part 112 and one groove 122 together form the end part of the conductive column 102. Or, referring to FIG. 12, the sectional shape of the first protection part 112 is a loop, the sectional shape of the groove 122 is a circle, and the first protruding part 112 and one groove 122 together form the end part of the conductive column 102.

As the first protruding part 112 is a cross-shaped structure or an enclosed loop structure and the central axis of the first protruding part 112 is coincided with that of the conductive column 102, when the contact position between the conductive column 102 and the electric connection layer 103 is affected by a stress in various directions, the first protruding part 112 is mutually spliced with the second protruding part 113, so as to avoid the relative sliding between the conductive column 102 and the electric connection layer 103 in various directions, and further reduce the risk that the electric connection layer 103 breaks away.

Figure 13:
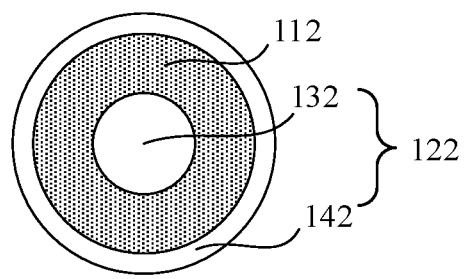
FIG. 13 is a seventh schematic diagram of several sectional structures of one end of a conductive column with a first protruding part and a groove according to an embodiment of this disclosure.

In another embodiment, referring to FIG. 13, the end part of the conductive column 102 includes a central area and a peripheral area surrounding the central area, and a groove 122 is at least located in partial peripheral area.

Herein, the groove 122 includes a first groove 132 and a second groove 142, the orthographic projection of the first groove 132 on the base 101 is a circle, the orthographic projection of the second groove 142 on the base 101 is a closed loop, and the second groove 142 surrounds the first groove 132 and is also located in the peripheral area.

Compared with the case that a groove 122 includes two grooves 122 in which the sides of the two grooves 122 both abut against the side of the second protection part 113, the groove 122 including the first groove 132 and the second groove 142 is beneficial to further increase the contact area between the conductive column 102 and the electric connection layer 103, and reduce the contact resistance between the conductive column 102 and the electric connection layer 103, thus improve the electric performance of the semiconductor structure.

It needs to be noted that, in addition to the cases listed above, the distribution of first protruding part(s) 112 and groove(s) 122 at the end part of a conductive column 102 may have other shapes, numbers and arrangement manners. Those skilled in the art know that the above schematic structures are provided for those skilled in the art to understand the conductive structure provided by the embodiments, but not for indicating that the distribution of the first protruding part(s) 112 and the groove(s) 122 at the end part of a conductive column 102 only includes the cases listed above.

In conclusion, in the semiconductor structure provided by an embodiment of this disclosure, the first protruding part 112 is mutually spliced with the second protruding part 113, so the bottom surface and the side surface of the groove 122 both contact with the second protruding part 113, and the total contact area between the conductive column 102 and the electric connection layer 103 is increased, which is beneficial to increase the connection force between the conductive column 102 and the electric connection layer 103 and reduce the risk that the electric connection layer 103 breaks away the conductive column 102, and is also beneficial to reduce the contact resistance between the conductive column 102 and the electric connection layer 103 and improve the electric performance of the semiconductor structure. In addition, the side of the groove 122 and the side of the conductive column 102 located outside the base 102 both connect with the electric connection layer 103, so the relative sliding between the conductive column 102 and the electric connection layer 103 is prevented in a direction perpendicular to central axis of the conductive column 102, and the risk that the electric connection layer 103 breaks away is further reduced.

Another embodiment of this disclosure further provides a semiconductor structure, this embodiment is substantially the same as the previous embodiments except that the semiconductor structure further includes an isolation structure contacting with the side surfaces of the conductive columns. The semiconductor structure provided by the embodiment of this disclosure is described below in combination with the drawings. It needs to be noted that detail description of the part that is same as or corresponds to the previous embodiments is omitted herein, and a reference can be made to the descriptions of the previous embodiments.

Figure 14:
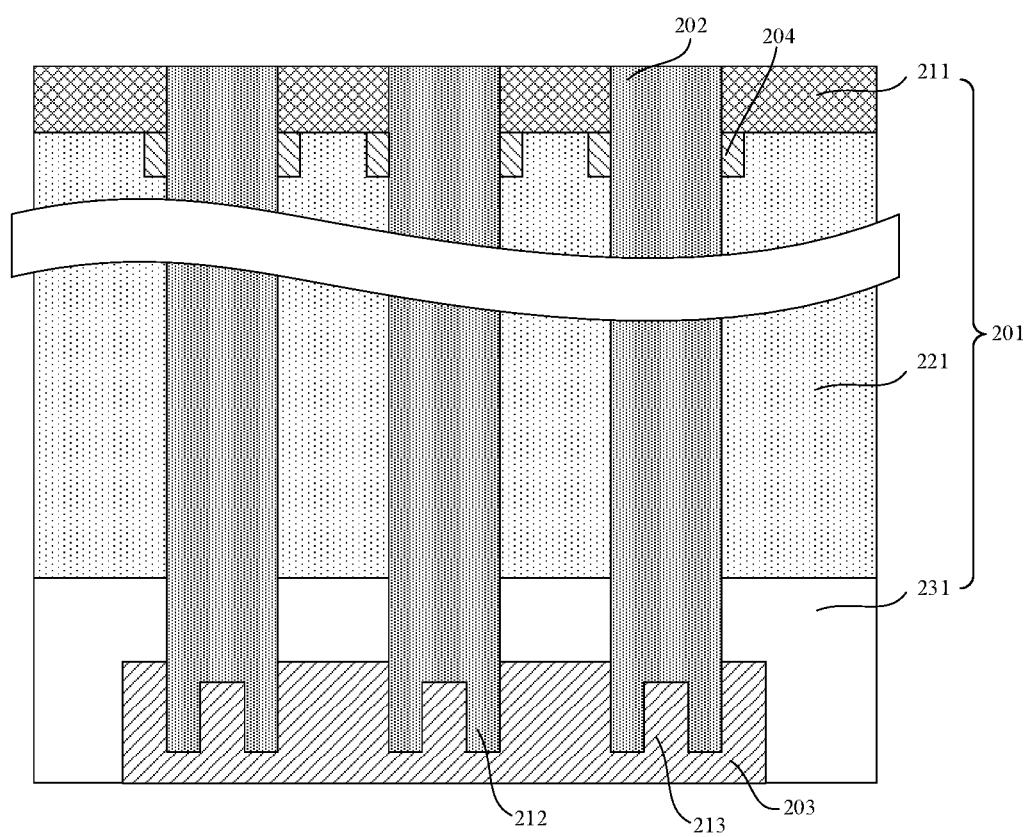
FIG. 14 is a schematic diagram of a sectional structure of a semiconductor structure according to another embodiment of this disclosure.

FIG. 14 is a schematic diagram of a sectional structure of a semiconductor structure according to another embodiment of this disclosure.

Referring to FIG. 14, the semiconductor structure includes: a base 201 which includes a first dielectric layer 211, a substrate 221 and a second dielectric 231 that are successively stacked; conductive columns 202, each of which includes a first protruding part 212 and a first groove; and an electric connection layer 203, which includes a second protruding part 213. Further, the semiconductor structure further includes at least one isolation structure 204, which is located in the base 201 and contacts with the side surface of each conductive column 202.

Herein, the isolation structure 204 is located on the side of each conductive column 202 at the end away from the electric connection layer 203. When a conductive column 202 is in thermal expansion, the thermal stress mainly focuses on the end part of the conductive column 202, and the isolation structure 204 located at the side of the end part of the conductive column 202 may be used as a stress buffer layer, which is beneficial to block the diffusion of the thermal stress when the conductive column 202 is in thermal expansion and reduce the pushing effect of the conductive column 202 to a structure adjacent to the conductive column 202.

A high etching selection ratio is between the material of the isolation structure 204 and the material of the substrate 221. Herein, the material of the isolation structure 204 may be silicon oxide, silicon carbonitride, silicon oxynitride or silicon nitride.

The specific distribution of the isolation structure 204 on the side surface of the conductive column 202 is described below in combination with FIG. 15-FIG. 18, which are schematic diagrams of several sectional structures of a combined structure of an isolation structure and a conductive column according to the second embodiment of this disclosure.

Figure 15:
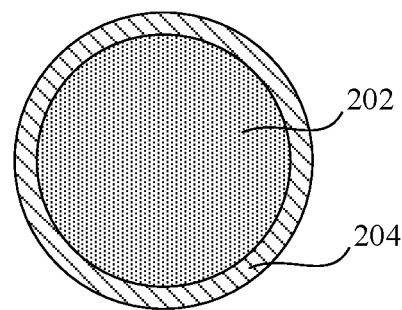
FIG. 15 is a first schematic diagram of several sectional structures of a combined structure of an isolation structure and a conductive column according to another embodiment of this disclosure.

In some embodiments, referring to FIG. 15, the isolation structure 204 is a closed loop structure, which is arranged around the side surface of the conductive column 202.

The annular isolation structure 204 covers the side surface of the conductive column 202, so when the conductive column 202 is in thermal expansion, the isolation structure 204 can prevent the thermal stress of the conductive column 202 diffusing towards various directions, thus it is beneficial to improve the stress buffer effect of the isolation structure and further reduce the pushing effect of the conductive column 202 to a structure adjacent to the conductive column 202.

Figure 16:
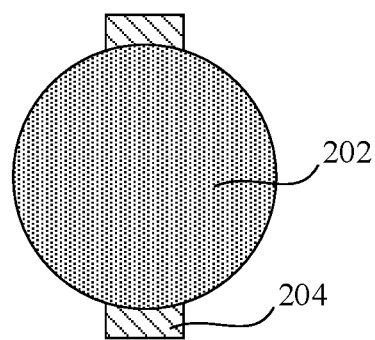
FIG. 16 is a second schematic diagram of several sectional structures of a combined structure of an isolation structure and a conductive column according to another embodiment of this disclosure.
Figure 17:
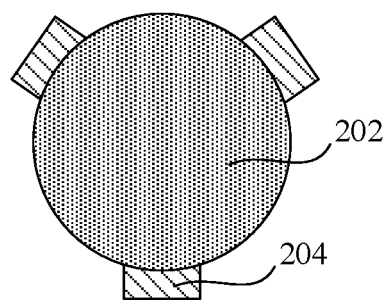
FIG. 17 is a third schematic diagram of several sectional structures of a combined structure of an isolation structure and a conductive column according to another embodiment of this disclosure.
Figure 18:
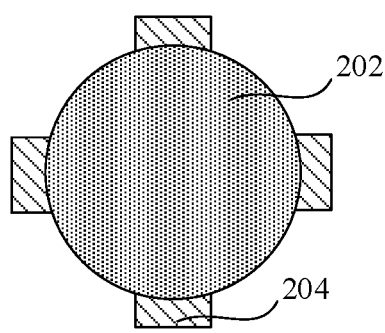
FIG. 18 is a fourth schematic diagram of several sectional structures of a combined structure of an isolation structure and a conductive column according to another embodiment of this disclosure.

In other embodiments, referring to FIG. 16-FIG. 18, the base 101 (referring to FIG. 1) includes at least two isolation structures 204, which are arranged around the side of the conductive column 202 at intervals. Herein, the sectional shape of the isolation structure 204 is arc-sided quadrangle.

Herein, referring to FIG. 16, two isolation structures 204 are uniformly arranged around the side surface of the conductive column 202 at intervals. Or, referring to FIG. 17, three isolation structures 204 are uniformly arranged around the side surface of the conductive column 202 at intervals. Or, referring to FIG. 18, four isolation structures 204 are uniformly arranged around the side surface of the conductive column 202 at intervals.

In addition, the orthographic projection of the contact surface between the isolation structure 204 and the conductive column 202 on the base 101 is coincided with that of the contact surface between the first protruding part 212 and the electric connection layer 203 on the base 101.

It needs to be noted that, in addition to the cases listed above, the distribution of the isolation structure 204 on the side surface of the conductive column 202 may have other shapes, numbers and arrangement manners. Those skilled in the art know that the above schematic structures are convenient for those skilled in the art to understand the conductive structure provided by the embodiment, and instead of indicating that the distribution of the isolation structure 204 on the side surface of the conductive column 202 only includes the cases listed above.

In the semiconductor structure, in addition that the conductive column 202 is provided with the groove spliced with the second protruding part 213 of the electric connection layer 203, which is beneficial to reduce the risk of the electric connection layer 203 breaking away and reduce the contact resistance between the conductive column 202 and the electric connection layer 203, the side surface of the conductive column 202 is also provided with the isolation structure 204, so that when the conductive column 202 is in thermal expansion, the isolation structure 204 is used as a stress buffer layer which is beneficial to reduce the pushing effect of the conductive column 202 on a structure adjacent to the conductive column 202.

Figure 19:
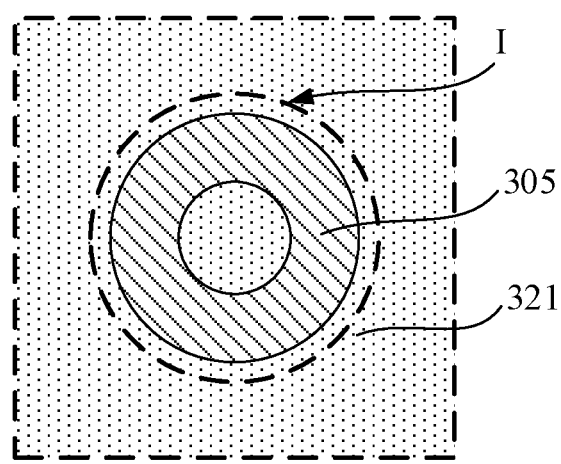
FIG. 19 is a first schematic diagram of two local sectional structures of a base with an initial isolation structure according to another embodiment of this disclosure.
Figure 20:
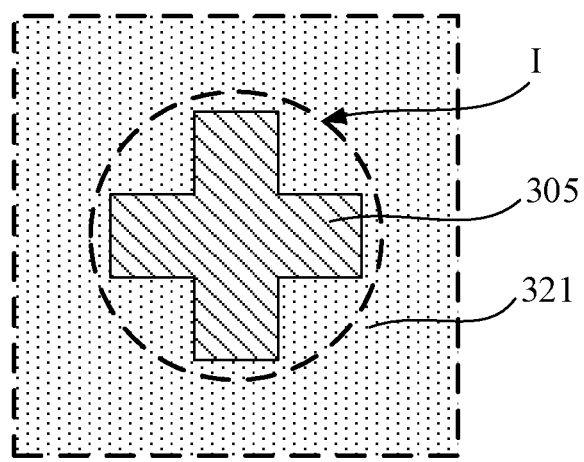
FIG. 20 is a second schematic diagram of two local sectional structures of a base with an initial isolation structure according to another embodiment of this disclosure.

Another embodiment of this disclosure further provides a method for manufacturing a semiconductor structure, and the method can be used for manufacturing the semiconductor structure provided by an embodiment of this disclosure. FIG. 19-FIG. 20 are schematic diagrams of two local sectional structures of a base with an initial isolation structure before forming a first through hole in the method for manufacturing a semiconductor structure according to yet another embodiment of this disclosure, and FIG. 21-FIG. 28 are schematic diagrams of local sectional structures corresponding to each operations of a method for manufacturing a semiconductor structure based on FIG. 19 according to yet another embodiment of this disclosure.

Figure 21:
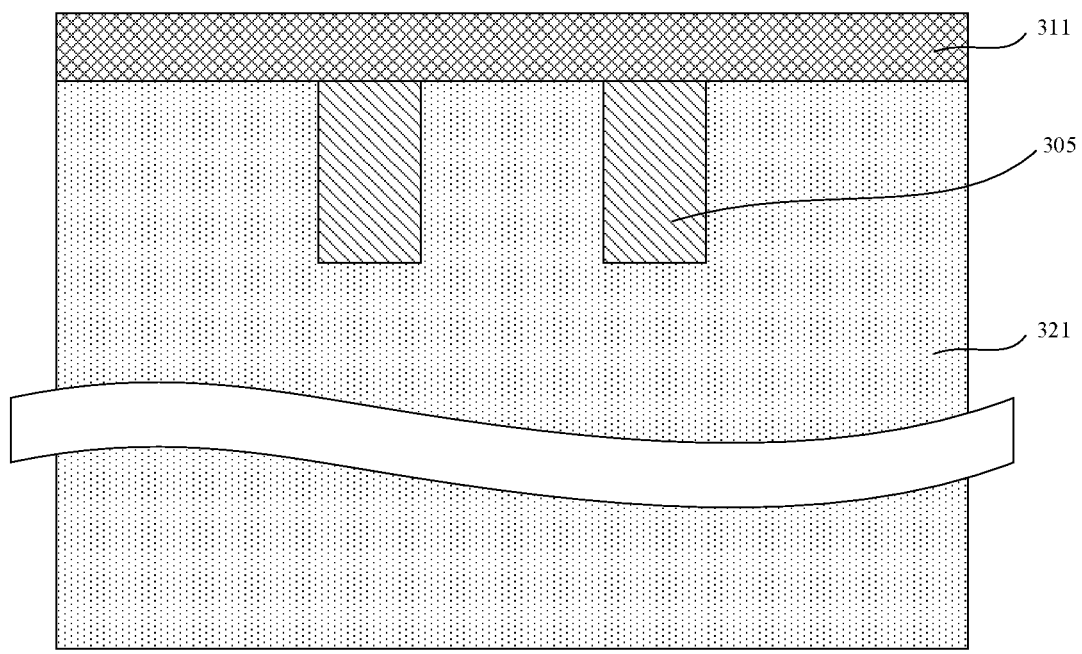
FIG. 21 is a first schematic diagram of local sectional structures corresponding to various steps in a method for manufacturing a semiconductor structure based on FIG. 18 according to another embodiment of this disclosure.
Figure 24:
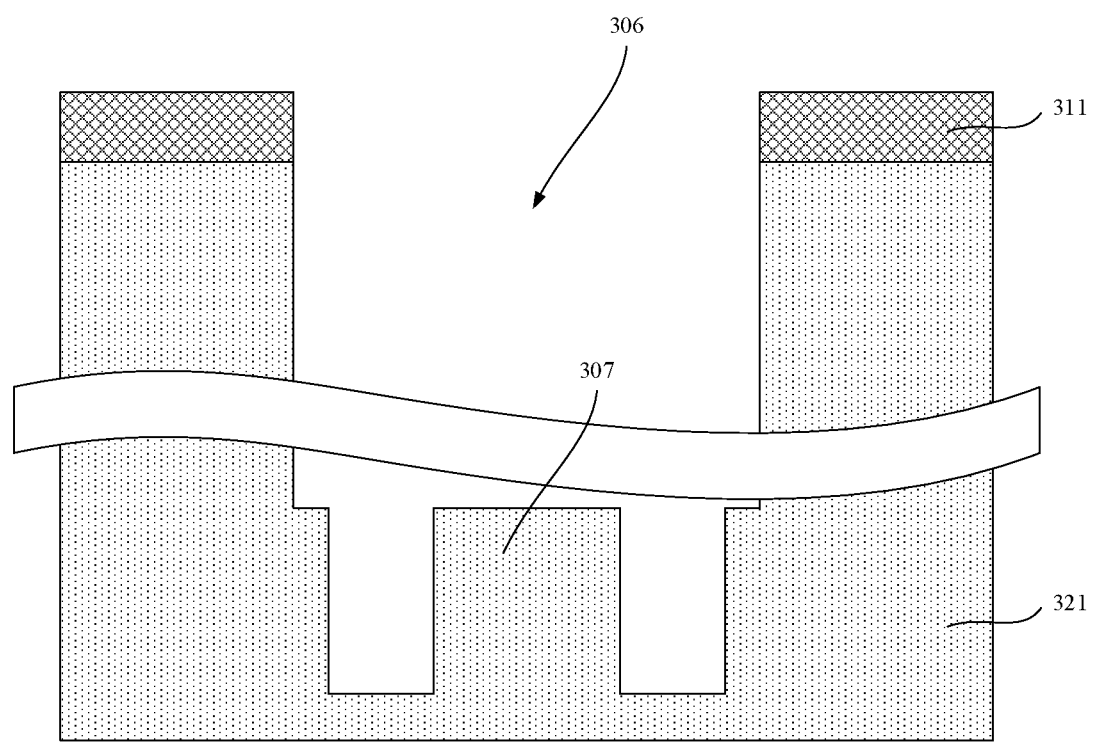
FIG. 24 is a fourth schematic diagram of local sectional structures corresponding to various steps in a method for manufacturing a semiconductor structure based on FIG. 18 according to another embodiment of this disclosure.

Referring to FIG. 19 and FIG. 21, a base is provided, and the base includes a conductive column region I. Referring to FIG. 24, a first through hole 306 is formed in the base of the conductive column region I, and the bottom of the first through hole 306 is provided with at least one first protruding structure 307.

Still referring to FIG. 21, before forming the first through hole 306, at least one initial isolation structure 305 is formed in the base, and the initial isolation structure 305 is at least located in partial conductive column region I. Herein, the base includes a first dielectric layer 311 and a substrate 321 that are successively stacked, and the initial isolation structure 305 is located in the substrate 321.

The specific distribution of the initial isolation structure in the substrate is described below in combination with FIG. 19-FIG. 20.

In some embodiments, referring to FIG. 19, the initial isolation structure 305 is a closed annular structure, which is completely located in the conductive column region I. It needs to be noted that when the initial isolation structure 305 as shown in FIG. 19 is adopted, the sectional shape of the conductive column subsequently formed is as shown in FIG. 13.

In some other embodiments, referring to FIG. 20, the initial isolation structure 305 is a cross-shaped structure, and is completely located in the conductive column region I. It needs to be noted that the determination of the conductive column region I on the substrate 321 is in order to determine the position of the conductive column subsequently formed, and when the initial isolation structure 305 as shown in FIG. 20 is adopted, the sectional shape of the conductive column subsequently formed is as shown in FIG. 11.

Figure 22:
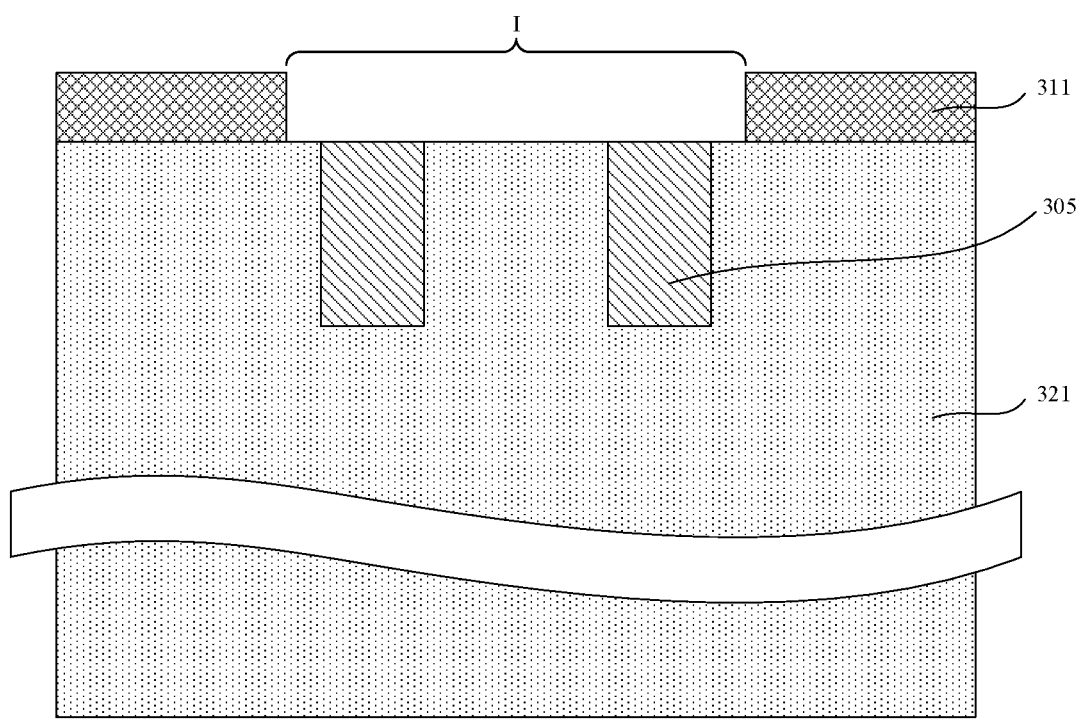
FIG. 22 is a second schematic diagram of local sectional structures corresponding to various steps in a method for manufacturing a semiconductor structure based on FIG. 18 according to another embodiment of this disclosure.

Referring to FIG. 22, the first dielectric layer 311 corresponding to the conductive column region I is etched, so as to expose the initial isolation structure 305 and the substrate 321 in the conductive column region I.

The specific step of forming the first through hole includes the following operations.

Figure 23:
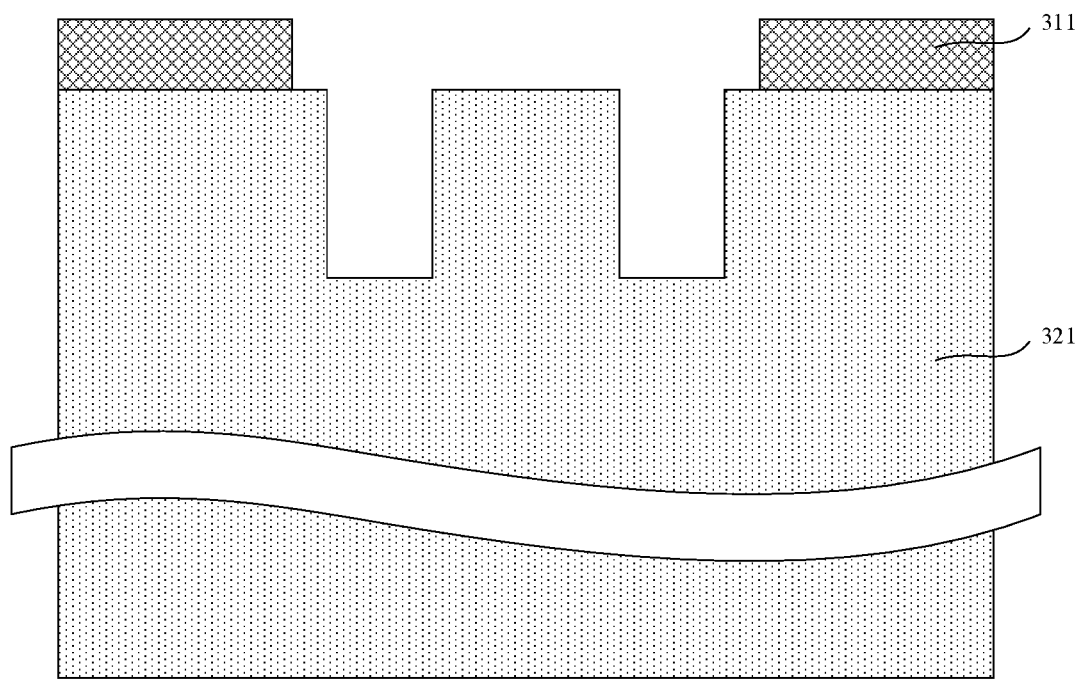
FIG. 23 is a third schematic diagram of local sectional structures corresponding to various steps in a method for manufacturing a semiconductor structure based on FIG. 18 according to another embodiment of this disclosure.

Referring to FIG. 23, the initial isolation structure 305 (referring to FIG. 22) located in the conductive column region I is removed until the substrate 321 right below the initial isolation structure 305 is exposed.

Herein, there is a high etching selection ratio between the initial isolation structure 305 and the substrate 321, which is beneficial to ensure not to damage the surface of the substrate 321 when removing the initial isolation structure 305.

Referring to FIG. 24, the substrate 321 located in the conductive column region I is etched to form the first through hole 306, and the bottom of the first through hole 306 is provided with at least one first protruding structure 307.

Herein, the substrate 321 located in the conductive column region I may be etched by dry etching, and during the dry etching process, a preset height of the first protruding structure 307 is kept by adjusting bombarding energy (namely, adjusting bias voltage).

Figure 25:
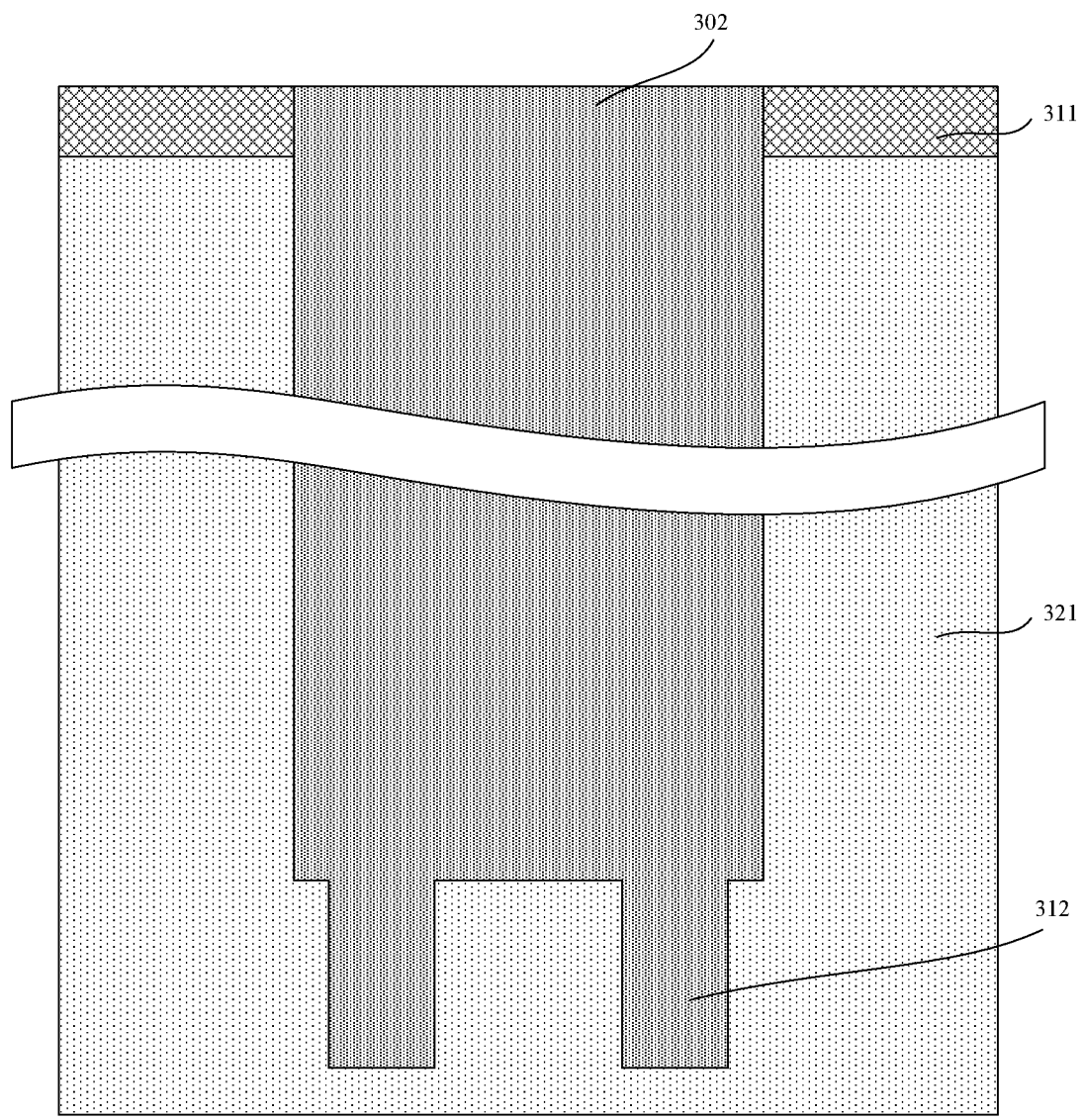
FIG. 25 is a fifth schematic diagram of local sectional structures corresponding to various steps in a method for manufacturing a semiconductor structure based on FIG. 18 according to another embodiment of this disclosure.

Referring to FIG. 25, the first through hole (referring to FIG. 24) is filled to form a conductive column 302. The conductive column 302 is provided with a groove at a position corresponding to the first protruding structure 307, and the conductive column 302 is provided with a first protruding part 312 defining the groove. Specifically, the plane of the side wall of the first protruding part 312 is not coincided with that of the side wall of the conductive column 302, which is beneficial to further increase the contact area between the electric connection layer subsequently formed and the conductive column 302, increase the connection force between the electric connection layer and the conductive column 302, and reduce the risk of the electric connection layer breaking away.

Figure 26:
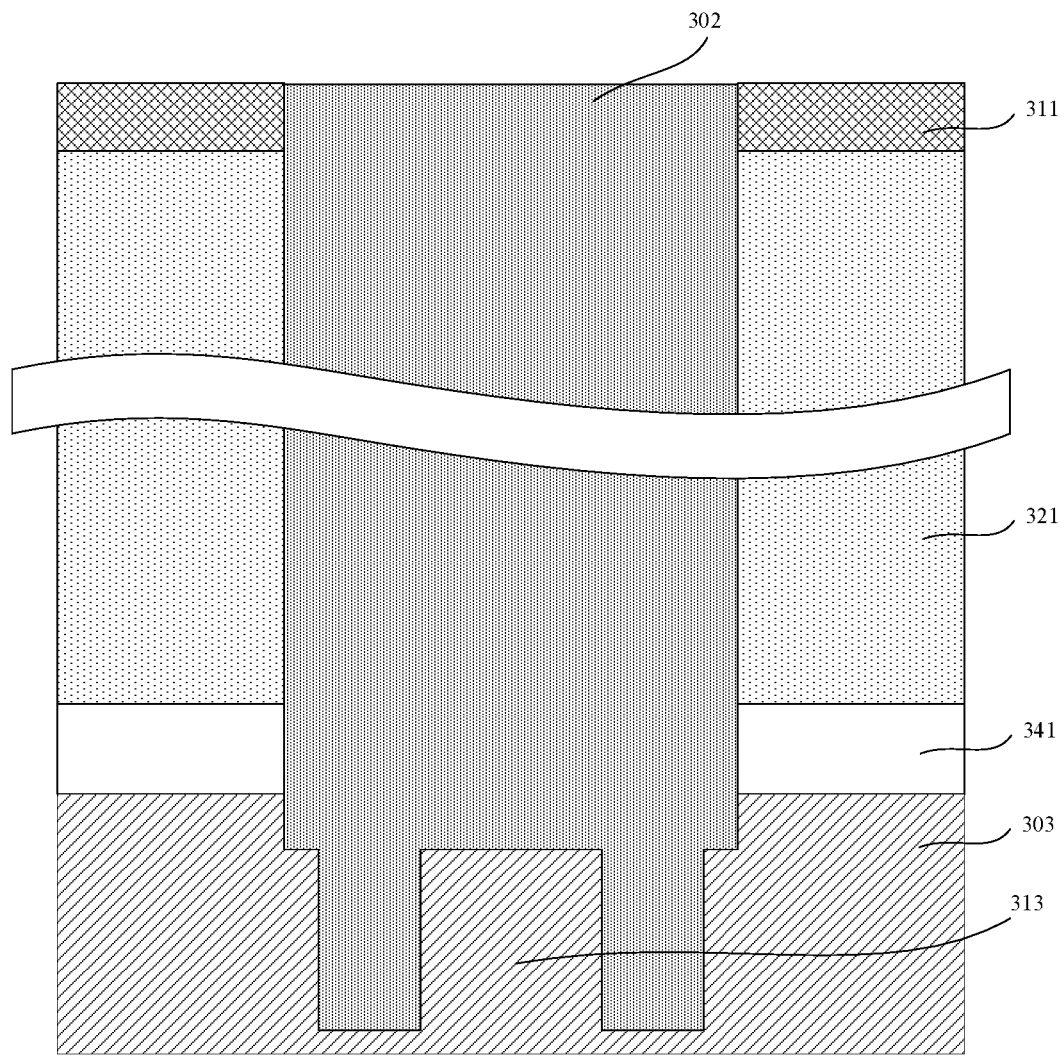
FIG. 26 is a sixth schematic diagram of local sectional structures corresponding to various steps in a method for manufacturing a semiconductor structure based on FIG. 18 according to another embodiment of this disclosure.

Referring to FIG. 26, the substrate 321 closing to the first protruding part 312 (referring to FIG. 25) is etched to expose the bottom of the groove. The electric connection layer 303 filling up the groove is formed, and the electric connection layer 303 is provided with a second protruding part 313 at a position corresponding to the groove.

Herein, before etching the substrate 312 closing to the first protruding structure 312, the surface of the substrate 321 on one side closing to the first protruding structure 312 needs to be polished until to expose the surface of the first protruding structure 321, and the specific polishing method includes chemical mechanical polishing.

Figure 27:
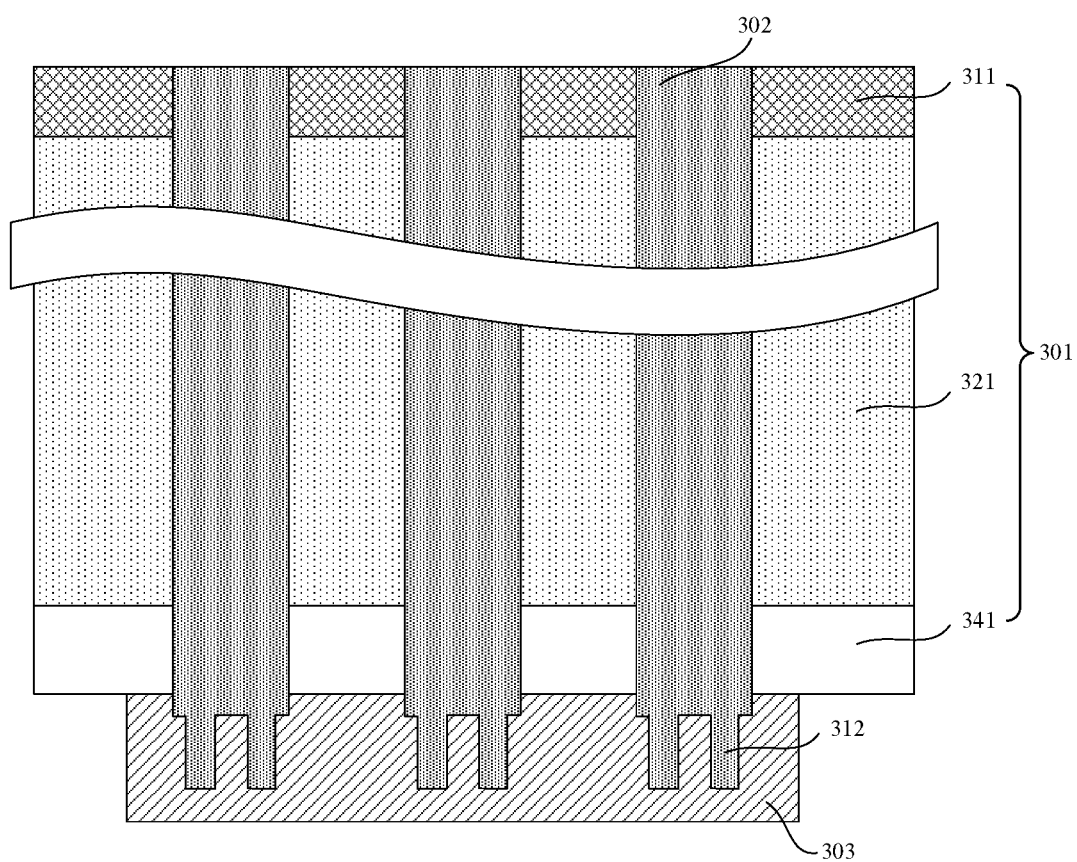
FIG. 27 is a seventh schematic diagram of local sectional structures corresponding to various steps in a method for manufacturing a semiconductor structure based on FIG. 18 according to another embodiment of this disclosure.

Referring to FIG. 27, after etching the substrate 321 closing to the first protruding structure 312, and before forming the electric connection layer 303 filling up the groove, is the method further includes that a third dielectric layer 341 is formed on the side, away from the initial isolation structure, of the substrate 321, the third dielectric layer 341 exposes the groove, and the third dielectric layer 341 is used as the second dielectric layer.

Figure 28:
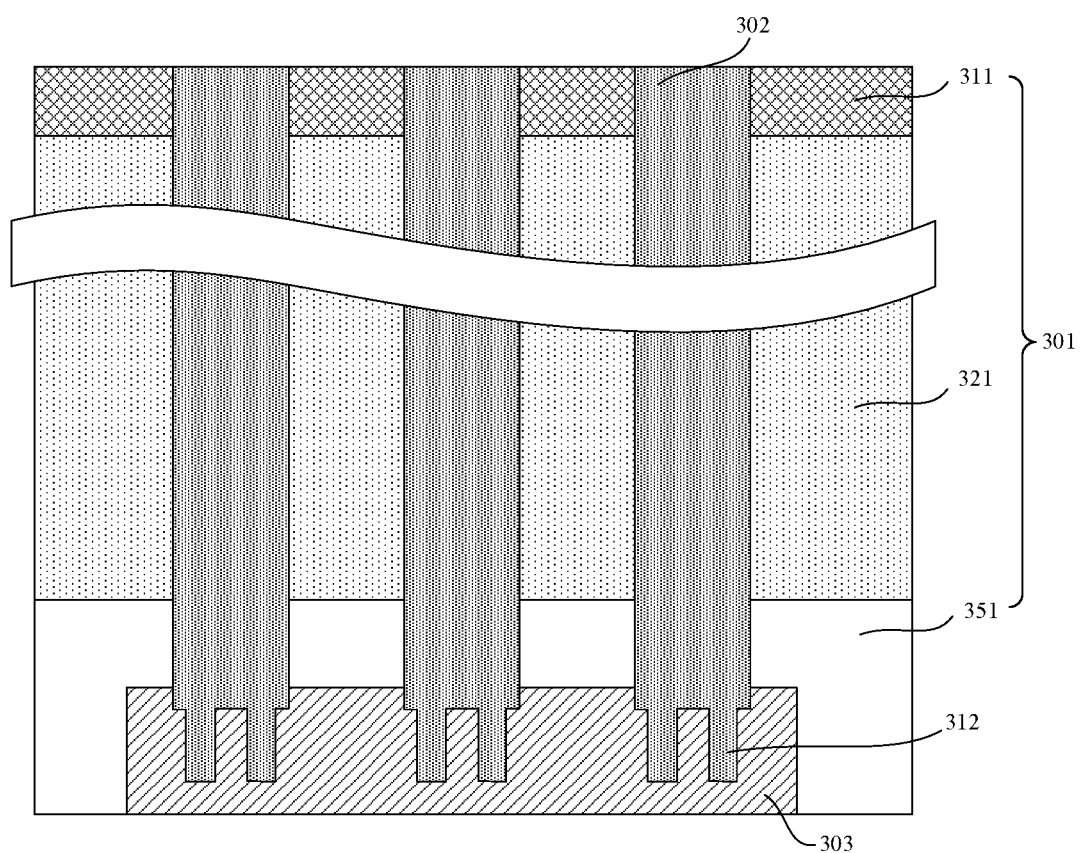
FIG. 28 is an eighth schematic diagram of local sectional structures corresponding to various steps in a method for manufacturing a semiconductor structure based on FIG. 18 according to another embodiment of this disclosure.

Or, referring to FIG. 28, after etching the base 301 closing to the first protruding structure 312, the step of forming the electric connection layer 303 filling up the groove further includes: a fourth dielectric layer 351 is formed on the side, away from the initial isolation structure, of the substrate 321, and the conductive column 302 is located in the fourth dielectric layer. The fourth dielectric layer 351 is etched to form a second through hole which exposes the groove; and the second through hole is filled to form the electric connection layer 303, and the remaining fourth dielectric layer 351 that is not etched is used as the second dielectric layer.

In conclusion, the initial isolation structure 305 is formed in the substrate 321, which is beneficial to subsequently form the first through hole 306 with the first protruding structure 307. Therefore, the conductive column 302 formed by filling the first through hole 306 is provided with the first protruding part 312 and the groove, which facilitates the second protruding part 313 of the electric connection layer 303 subsequently formed being embedded into the groove, so that the electric connection layer 303 is more firmly connected to the conductive column, thereby reducing the risk that the electric connection layer 303 breaks away. In addition, the groove is mutually spliced with the second protruding part 312, so the contact area between the electric connection layer 303 and the conductive column 302 is increased, which is beneficial to reduce the contact resistance between the electric connection layer 303 and the conductive column 302 and improve the electric performance of the semiconductor structure.

Again another embodiment of this disclosure provides a method for manufacturing a semiconductor structure, and the method can be used for preparing the semiconductor structure provided by another embodiment of this disclosure. It differs from the yet another embodiment in that each initial isolation structure also extends to the base adjacent to the conductive column region. In this embodiment, FIG. 29-FIG. 33 are schematic diagrams of several local sectional structures of a base with an initial isolation structure before forming a first through hole in a method for manufacturing a semiconductor structure according to said again another embodiment of this disclosure, and FIG. 34 is a schematic diagram of a sectional structure of a semiconductor structure formed based on FIG. 31 according to the again another embodiment of this disclosure. As for the part that is the same as or corresponds to that in the yet another embodiment is omitted herein, which may be referred to the corresponding description of the yet another embodiment.

Figure 31:
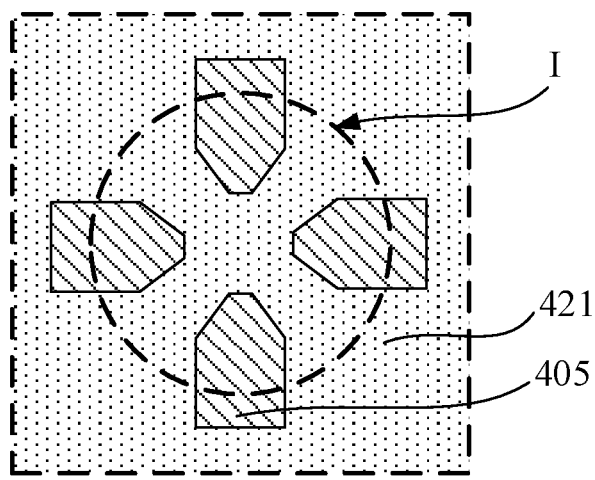
FIG. 31 is a third schematic diagram of several local sectional structures of a base with an initial isolation structure according to yet another embodiment of this disclosure.

Referring to FIG. 31 and FIG. 34 in combination, each initial isolation structure 405 further extends into the base 401 adjacent to the conductive column region I. After forming the first through hole, the remaining initial isolation structure 405 located in the base 401 adjacent to the conductive column region I is used as the isolation structure 404, and partial side wall of the formed first through hole exposes the side surface of the isolation structure 404.

The specific distribution of the initial isolation structure(s) in the substrate is described below in combination with FIG. 28-FIG. 32.

Figure 29:
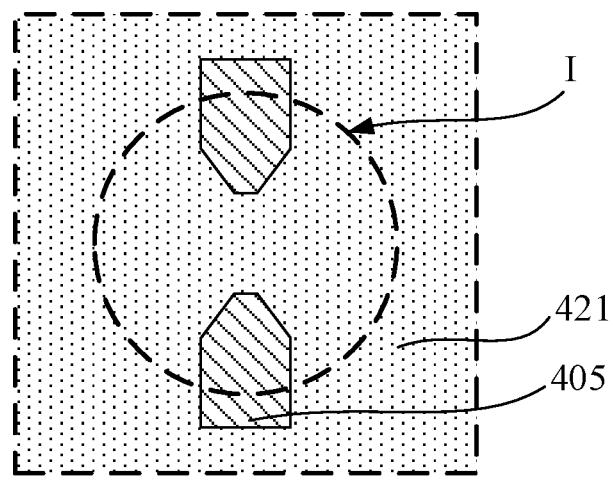
FIG. 29 is a first schematic diagram of several local sectional structures of a base with an initial isolation structure according to yet another embodiment of this disclosure.
Figure 30:
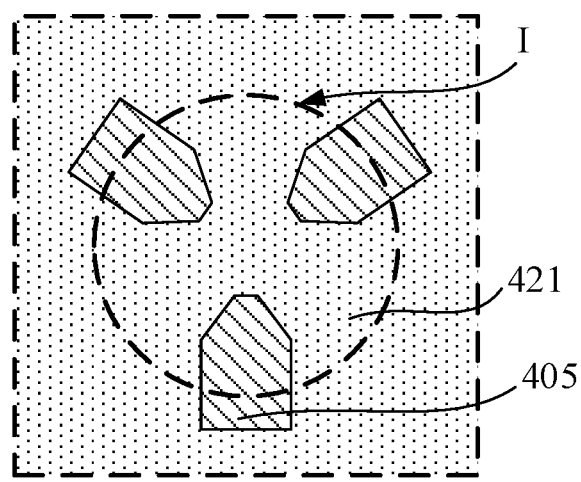
FIG. 30 is a second schematic diagram of several local sectional structures of a base with an initial isolation structure according to yet another embodiment of this disclosure.

In some embodiments, referring to FIG. 29-FIG. 31, the number of the initial isolation structures 405 is multiple, and the orthographic projections of the multiple initial isolation structures 405 on the substrate 421 are axisymmetric shapes.

Herein, the sectional shape of a single initial isolation structure 405 (namely, the orthographic projection of the initial isolation structure 405 on the substrate 421) is formed by combining one isosceles trapezoid and one quadrangle. In other embodiments, the shape of the initial isolation structure may also be rectangular, circular, elliptic, etc.

Referring to FIG. 29, two initial isolation structures 405 are uniformly arranged around the central axis of the conductive column region I at intervals. It needs to be noted that when the initial isolation structures 405 as shown in FIG. 29 are adopted, the sectional shape of the conductive column subsequently formed is as shown in FIG. 7.

Or, referring to FIG. 30, three initial isolation structures 405 are uniformly arranged around the central axis of the conductive region I at intervals. It needs to be noted that when the initial isolation structures 405 as shown in FIG. 30 are adopted, the sectional shape of the conductive column subsequently formed is as shown in FIG. 8.

Or, referring to FIG. 31, four initial isolation structures 405 are uniformly arranged around the central axis of the conductive region I 102 at intervals. It needs to be noted that when the initial isolation structures 405 as shown in FIG. 31 are adopted, the sectional shape of the conductive column subsequently formed is as shown in FIG. 9.

It needs to be noted that this embodiment do not make limitations to the number of the initial isolation structure(s) 405.

Figure 32:
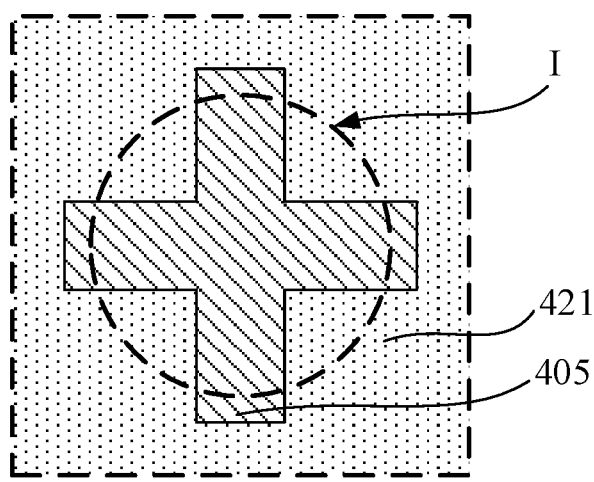
FIG. 32 is a fourth schematic diagram of several local sectional structures of a base with an initial isolation structure according to yet another embodiment of this disclosure.
Figure 33:
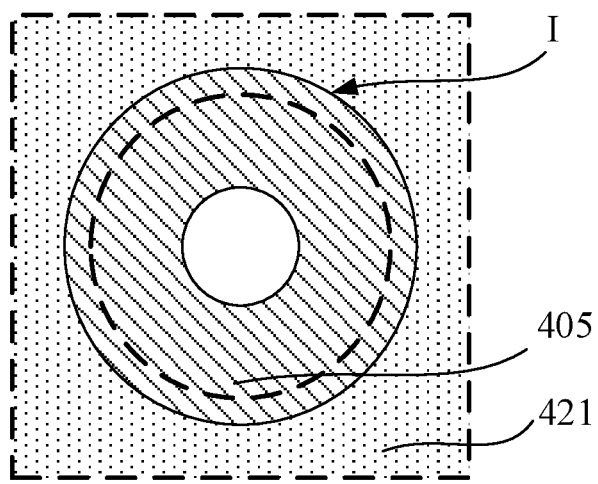
FIG. 33 is a fifth schematic diagram of several local sectional structures of a base with an initial isolation structure according to yet another embodiment of this disclosure.
Figure 34:
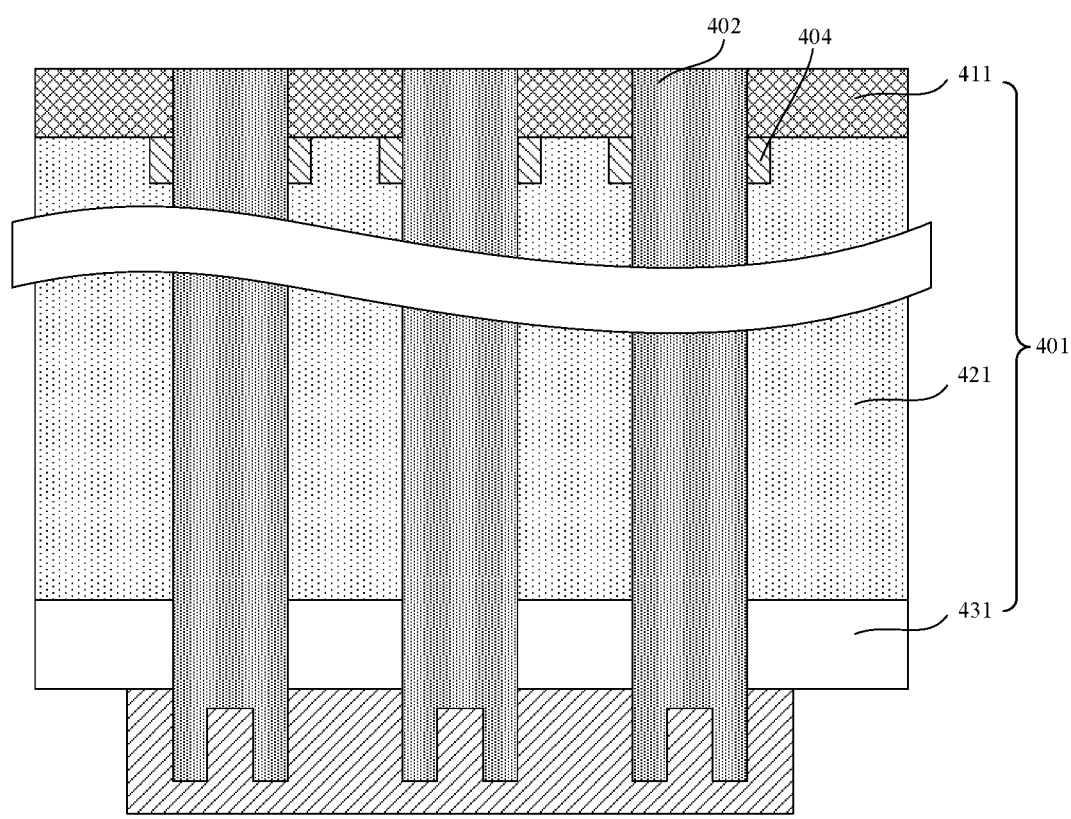
FIG. 34 is a schematic diagram of a sectional structure of a semiconductor structure formed based on FIG. 30 according to yet another embodiment of this disclosure.

In some other embodiments, referring to FIG. 32-FIG. 33, the number of the initial isolation structure 405 is one, and the orthographic projection of the initial isolation structure 405 on the substrate 421 is an axisymmetric shape.

Herein, the orthographic projection of the initial isolation structure 405 on the substrate 421 may be annular or crossed.

Referring to FIG. 32, the sectional shape of the initial isolation structure 405 is cross-shaped. It needs to be noted that when the initial isolation structure 405 as shown in FIG. 32 is adopted, the sectional shape of the conductive column subsequently formed is as shown in FIG. 10.

Or, referring to FIG. 33, the sectional shape of the initial isolation structure 405 is a closed loop. It needs to be noted that when the initial isolation structure 405 as shown in FIG. 33 is adopted, the sectional shape of the conductive column subsequently formed is as shown in FIG. 12.

In conclusion, each initial isolation structure 405 extends into the base 401 adjacent to the conductive column region I, therefore when etching the substrate 421 to form the first through hole, the side wall of the first through hole will expose the initial isolation structure 405 that is not etched (namely, the isolation structure 404 located on the side surface of the conductive column 402 subsequently formed). On the one hand, in the step of etching the substrate 401 to form the first through hole, the etching selection ratio between the isolation structure 404 and the substrate 421 is high, thus the isolation structure 404 is beneficial to avoid the lateral etching phenomenon during an etching process. That is, the substrate 421 located outside the conductive column region I will not be etched. On the other hand, when the conductive column 402 is in thermal expansion, the isolation structure 404 may be used as a stress buffer layer, which is beneficial to reduce the pushing effect of the conductive column 402 to a structure adjacent to the conductive column 402.

Those of ordinary skill in the art may understand that the abovementioned implementation modes are specific embodiments for realizing this disclosure. However, in actual disclosure, various changes may be made to the forms and details without deviating from the spirit and scope of this disclosure. Those skilled in any art may make respective change and modification without deviating from the spirit and scope of this disclosure, therefore, the protection scope of this disclosure shall be subjected the scope defined in claims.

What is claimed is:

1. A method for manufacturing a semiconductor structure, comprising:

providing a base, the base comprising a conductive column region;

forming a first through hole in the base of the conductive column region, a bottom of the first through hole being provided with at least one first protruding structure;

filling the first through hole to form a conductive column, the conductive column being provided with a groove at a first position corresponding to the first protruding structure, and the conductive column being provided with a first protruding part defining the groove;

etching the base close to the first protruding structure to expose a bottom of the groove; and forming an electric connection layer filling up the groove, the electric connection layer being provided with a second protruding part at a second position corresponding to the groove;

the method further comprising: before forming the first through hole, forming at least one initial isolation structure in the base, wherein the initial isolation structure is at least located in partial conductive column region; and the forming the first through hole comprises:

removing the initial isolation structure located in the conductive column region until the base right below the initial isolation structure is exposed; and etching the base located in the conductive column region to form the first through hole.

2. The method for manufacturing a semiconductor structure of claim 1, wherein each initial isolation structure extends into the base adjacent to the conductive column region; after forming the first through hole, a remaining initial isolation structure located in the base adjacent to the conductive column region is used as an isolation structure, and partial side wall of the first through hole formed exposes the side surface of the isolation structure.

3. The method for manufacturing a semiconductor structure of claim 1, wherein the base comprises a first dielectric layer and a substrate that are successively stacked, and the initial isolation structure is located in the substrate; before removing the initial isolation structure located in the conductive column region, the first dielectric layer corresponding to the conductive column region is etched to expose both the initial isolation structure and the substrate located in the conductive column region.

4. The method for manufacturing a semiconductor structure of claim 1, wherein the base comprises a first dielectric layer and a substrate that are successively stacked, and an initial isolation structure is provided in the substrate; after etching the base closing to the first protruding structure and before forming the electric connection layer filling up the groove, the method further comprises: forming a third dielectric layer on a side, away from the initial isolation structure, of the substrate, the third dielectric layer exposing the groove, and the third dielectric layer being used as the second dielectric layer.

5. The method for manufacturing a semiconductor structure of claim 1, wherein the base comprises a first dielectric layer and a substrate that are successively stacked, and an initial isolation structure is provided in the substrate; after etching the base closing to the first protruding structure, the forming the electric connection layer filling up the groove further comprises: forming a fourth dielectric layer on a side, away from the initial isolation structure, of the substrate, the conductive column being located in the fourth dielectric layer; etching the fourth dielectric layer to form a second through hole, the second through hole exposing the groove; filling the second through hole to form the electric connection layer, a remaining fourth dielectric layer that is not etched being used as the second dielectric layer.

* * * * *